United States Patent
Chen

(10) Patent No.: US 9,899,633 B2
(45) Date of Patent: Feb. 20, 2018

(54) OLED DISPLAY AND DISPLAY MODULE HAVING GRADIENT CHANGE OF REFLECTIVITIES

(71) Applicant: Shenzhen China Star Optoelectronics Technology Co., Ltd., Shenzhen, Guangdong (CN)

(72) Inventor: Lixuan Chen, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 184 days.

(21) Appl. No.: 14/907,688

(22) PCT Filed: Dec. 25, 2015

(86) PCT No.: PCT/CN2015/098973
§ 371 (c)(1),
(2) Date: Jan. 26, 2016

(87) PCT Pub. No.: WO2017/075880
PCT Pub. Date: May 11, 2017

(65) Prior Publication Data
US 2017/0263898 A1   Sep. 14, 2017

(30) Foreign Application Priority Data
Nov. 4, 2015 (CN) .......................... 2015 1 0745355

(51) Int. Cl.
*H01L 29/08* (2006.01)
*H01L 35/24* (2006.01)
(Continued)

(52) U.S. Cl.
CPC ...... *H01L 51/5293* (2013.01); *H01L 51/5016* (2013.01); *H01L 51/5072* (2013.01);
(Continued)

(58) Field of Classification Search
CPC ............. H01L 51/5293; H01L 51/5206; H01L 51/5221; H01L 51/5092; H01L 51/5072; H01L 51/5016
See application file for complete search history.

(56) References Cited

U.S. PATENT DOCUMENTS

2007/0034864 A1* 2/2007 Liu .................... H01L 51/5048
257/40
2011/0025201 A1 2/2011 Ikemoto
(Continued)

FOREIGN PATENT DOCUMENTS

CN   102820433 A   12/2012
CN   104393016 A   3/2015

*Primary Examiner* — Matthew Gordon
(74) *Attorney, Agent, or Firm* — Andrew C. Cheng

(57) ABSTRACT

The present disclosure provides an OLED display and display module thereof. The OLED display module includes: a cathode plate, an anode plate and a luminance function layer sandwiched in between the cathode plate and the anode plate, and characterized in that multiple reflectivities among multiple layers of the luminance function layer are satisfied with a following relationship, which is a reflectivity of the material of the luminance function layer near to the cathode plate is greatly higher than a reflectivity of another material of the luminance function layer distant from the cathode plate. The display module solves the technical problem of decreasing the contrast and sharpness of the OLED display caused by the cathode plate with the high reflectivity.

16 Claims, 2 Drawing Sheets

(51) Int. Cl.
*H01L 51/52* (2006.01)
*H01L 51/50* (2006.01)
*H01L 51/00* (2006.01)

(52) U.S. Cl.
CPC ...... *H01L 51/5092* (2013.01); *H01L 51/5206* (2013.01); *H01L 51/5221* (2013.01); *H01L 51/005* (2013.01); *H01L 51/0061* (2013.01); *H01L 51/0067* (2013.01); *H01L 51/0072* (2013.01); *H01L 51/0077* (2013.01); *H01L 51/0078* (2013.01); *H01L 51/0081* (2013.01); *H01L 51/0084* (2013.01); *H01L 2251/301* (2013.01); *H01L 2251/558* (2013.01)

(56) References Cited

U.S. PATENT DOCUMENTS

| | | | |
|---|---|---|---|
| 2016/0163992 A1* | 6/2016 | Bae | H01L 51/0058 257/40 |
| 2016/0197307 A1 | 7/2016 | Cheng et al. | |
| 2016/0268552 A1 | 9/2016 | Yang et al. | |

\* cited by examiner

OLED DISPLAY AND DISPLAY MODULE HAVING GRADIENT CHANGE OF REFLECTIVITIES

FIELD OF THE INVENTION

The present invention relates to a technology field of an OLED display, and more particularly to an OLED display and a display module thereof.

BACKGROUND OF THE INVENTION

The organic electroluminesence diode (OLED) element is composed of a cathode, an anode and a luminance layer. The cathode is made of Al etc. metal material and the anode is made of ITO etc. material. Electrons and holes are respectively injected to the cathode and the anode to form excitons in the organic luminance layer to excite the luminance layer to luminesce. The present product in the laboratory mainly employs a transparent ITO anode. The element structure presents a condition of a top emission. However, in a production line, the ITO is always formed on a bottom, since an ITO deposition damages the organic material. Thus, a structure of a bottom emission is employed and lights are emitted from the cathode.

Currently, most of OLED employ an anode-luminance structure and the cathode is used as a reflection layer, so the cathode reflects environment lights and inside stray lights. In particular, the cathode made of the metal material has high reflectivity to decrease the contrast and sharpness of the OLED. A general solution is to add a ¼ wavelength plate and a polarizer on a light-emitting face of the OLED to improve the reflection problem, but it causes a high cost.

SUMMARY OF THE INVENTION

The embodiment of the present invention provides an OLED display and display module thereof to solve the technical problem of decreasing the contrast and sharpness of the OLED display caused by the cathode plate with the high reflectivity.

To solve the above-mentioned problem, the embodiment of the present invention provides the OLED display module. The OLED display module comprises: a cathode plate, an anode plate and a luminance function layer sandwiched in between the cathode plate and the anode plate. Multiple reflectivities among multiple layers of the luminance function layer are satisfied with a following relationship, which is a reflectivity of the material of the luminance function layer near to the cathode plate is greatly higher than a reflectivity of another material of the luminance function layer distant from the cathode plate.

According to a preferred embodiment, the luminance function layer comprises sequentially along a direction from the cathode plate to the anode plate: an electron ejection layer, an electron transport layer, a light emitting layer, a hole transport layer and a hole ejection layer.

According to a preferred embodiment, one-layer or multi-layer reflectivity-change layer(s) are formed among the layers of the luminance function layer.

According to a preferred embodiment, the reflectivity-change layer is made of inorganic material.

According to a preferred embodiment, a thickness of the reflectivity-change layer is less than 50 nm.

According to a preferred embodiment, a visible light with 500 nm±25 nm luminance wavelength range generated by the luminance function layer.

According to a preferred embodiment, a material of the hole ejection layer comprises one or more of CuPc, TCNQ, PPDN and TiOPC.

According to a preferred embodiment, a material of the hole transport layer comprises one or more of TCTA, F4TCNQ, TCNQ, PPDN, CuPc and TiOPC; and the hole transport layer is a multi-layer structure.

According to a preferred embodiment, the light emitting layer is made of a combination of phosphorescence material, TCTA and TAZ; a material of the electron transport layer comprises one or more of Alq3, BCP, Bphen, TPBi, Liq and Nbphen; and a material of the electron injection layer is one or more of LiF, LiBq4 and Alq3:Li3N.

To solve the above-mentioned problem, the present invention also provides the OLED display. The OLED display comprises any one of the above-mentioned OLED modules.

In comparison with the prior art, the OLED display and the display module thereof provided by the present invention, the reflectivities among the layers of the luminance function are satisfied with a following relationship, which is the reflectivity of the material of the luminance function layer near to the cathode plate is greatly higher than the reflectivity of another material of the luminance function layer distant from the cathode plate. It solves the technical problem of decreasing the contrast and sharpness of the OLED display caused by the cathode plate with the high reflectivity. In addition, to satisfy that the reflectivity of the material of the luminance function layer is greatly higher than the reflectivity of another material of the luminance function layer distant from the cathode plate, the present invention solution forms one-layer or multi-layer reflectivity-change layer(s) among the layers of the luminance function layer. The luminance function layer is used to obtain the gradient change of the reflectivities and to make the luminance function layer satisfy with the requirement of the gradient change. It further improves the technical problem of decreasing the contrast and sharpness of the OLED display caused by the cathode plate with the high reflectivity.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF THE PREFERRED EMBODIMENTS

Embodiments of the present invention are described in detail with the technical matters, structural features, achieved objects, and effects with reference to the accompanying drawings as follows. It is clear that the described embodiments are part of embodiments of the present invention, but not all embodiments. Based on the embodiments of the present invention, all other embodiments to those of ordinary skill in the premise of no creative efforts obtained, should be considered within the scope of protection of the present invention.

Figure 1:
FIG. 1 is a structural schematic drawing of an OLED display module of a preferred embodiment of the present invention.

Please refer to FIG. 1. FIG. 1 is structural schematic drawing of an OLED display module of a preferred embodiment of the present invention. The OLED display module comprises: a cathode plate 100, an anode plate 200 and a luminance function layer 300 sandwiched in between the cathode plate 100 and the anode plate 200. Multiple reflectivities among multiple layers of the luminance function layer 300 are satisfied with a following relationship, which is a reflectivity of a material of the luminance function layer 300 near to the cathode plate 100 is greatly higher than a reflectivity of another material of the luminance function layer 300 distant from the cathode plate 100. Specifically, the luminance function layer 300 generates a visible light with 500 nm±25 nm luminance wavelength range.

Particularly, the luminance function layer 300 comprises sequentially along a direction from the cathode plate 100 to the anode plate 200 but is not limited to following functional layers: an electron ejection layer 310, an electron transport layer 320, a light emitting layer 330, a hole transport layer 340, a hole ejection layer 350, etc.

The solution of the present invention is to change a structure of the OLED and to propose a new structure of decreasing the reflection of the cathode plate 100. According to the Fresnel equation of a penetrating optics theory, we can deduce that intensities of lights on a vertical polarization direction and a horizontal polarization direction satisfy with two following equations:

$$R_s = \left| \frac{n_1 \cos\theta_i - n_2 \cos\theta_t}{n_1 \cos\theta_i + n_2 \cos\theta_t} \right|^2 = \left| \frac{n_1 \cos\theta_i - n_2 \sqrt{1 - \left(\frac{n_1}{n_2} \sin\theta_i\right)^2}}{n_1 \cos\theta_i + n_2 \sqrt{1 - \left(\frac{n_1}{n_2} \sin\theta_i\right)^2}} \right|^2,$$

$$R_p = \left| \frac{n_1 \cos\theta_t - n_2 \cos\theta_i}{n_1 \cos\theta_t + n_2 \cos\theta_i} \right|^2 = \left| \frac{n_1 \sqrt{1 - \left(\frac{n_1}{n_2} \sin\theta_i\right)^2} - n_2 \cos\theta_i}{n_1 \sqrt{1 - \left(\frac{n_1}{n_2} \sin\theta_i\right)^2} + n_2 \cos\theta_i} \right|^2.$$

Wherein, Rs represents the intensity of lights on the vertical polarization direction, Rp represents the intensity of lights on the horizontal polarization direction, and θ is a light incidence and departure angle. n represents a reflectivity of lights passing through a medium material.

If the reflectivities of the functional layers arranged along the direction from the cathode plate 100 to the anode plate 200 are respectively and sequentially represented as n1, n2, n3, n4, n5, n6, n7 . . . , the reflectivities are satisfied with relationships of n1>>n2, n2>>n3, n3>>n4, n4>>n5, . . . . Since the luminance function layer 300 of the OLED has a N-layer structure, at least N−2 of the satisfied inequalities are required. The meaning of the inequality is that the reflectivity of the material of the luminance function layer 300 near to the cathode plate 100 is greatly higher than the reflectivity of the another material of the luminance function layer 300 distant from the cathode plate 100. More inequalities are satisfied and an effect is better.

Specifically, the anode plate is an Indium Tin Oxide (ITO) layer. The hole ejection layer 350 may be made of copper phthalocyanine (CuPc) having an excellent hole injection ability, or may be made of 2,3,5,6-tetrafluoro-7,7,8,-tetracyanoquinodimethane (F4TCNQ), tetracyanoquinodimethane (TCNQ), phenanthroline-23-dinitrile (PPDN), or titanyl-phthalocyanine (TiOPC).

The hole transport layer 340 may be made of 4,4',4"-tri (carbazole-9-yl)triphenylamine (TCTA) having an excellent hole transport ability, or may be made of 2,3,5,6-tetrafluoro-7,7,8,-tetracyanoquinodimethane (F4TCNQ), tetracyanoquinodimethane (TCNQ), phenanthroline-23-dinitrile (PPDN), copper phthalocyanine (CuPc), or titanyl-phthalocyanine (TiOPC).

Specifically, the hole transport layer 340 may be a multi-layer structure and 2 to 4 layers are preferred. A thickness of each layer may be different. The light emitting layer 330 may use a mixed-type main light emitting layer including a green phosphorescent material of fac-tris(2-phenylpyridine) iridium (Ir(ppy)3) and a red phosphorescent material of bis(2,4-diphenyl-quinoline)iridium(III) acetylanetonate (Ir(pq)2acac) co-doped with TCTA and 1,2,4-triazole derivative (3,5-diphenyl-4-naphthalene-1-yl-1,2,4-triazole, TAZ), and also uses an auxiliary light emitting layer including a blue phosphorescent material of FCNIr doped with mCP at the same time. According to the principle of colorimetry, one light emitting layer doped with red, green and blue light emitting materials generates white lights by color mixing.

The electron transport layer 320 may be made of quinoline aluminum (Alq3) having an excellent electron transport ability, or may be made of BCP (Bathocuproine), 4,7-diphenyl-1,10-phenanthroline (Bphen), 1,3,5-tri(N-phenyl-benzimidazol-2-yl)benzene (TPBi), hydroxyquinolinolate-lithium (Liq), 2,9-bis(2-naphthyl)-4,7-diphenyl-1,10-phenanthroline (Nbphen), or 1,2,4-triazole derivative (TAZ).

The electron injection layer 310 may be made of a low working function material such as LiF, which has an excellent electron injection ability, or may be made of lithiumtetra-(8-hydroxy-quinolinato)boron (LiBq4) or Alq3:Li3N (in which Li3N is an n-type doping agent, and Alq3 is the doped material).

Specifically, the cathode plate 100 is made of aluminum or silver to increase a conductivity thereof and a display effect of the display is better accordingly.

In comparison with the prior art, in the OLED display module provided by the present embodiment, the reflectivities among the layers of the luminance function are satisfied with the following relationship, which is the reflectivity of the material of the luminance function layer near to the cathode plate is greatly higher than the reflectivity of another material of the luminance function layer distant from the cathode plate.

Figure 2:
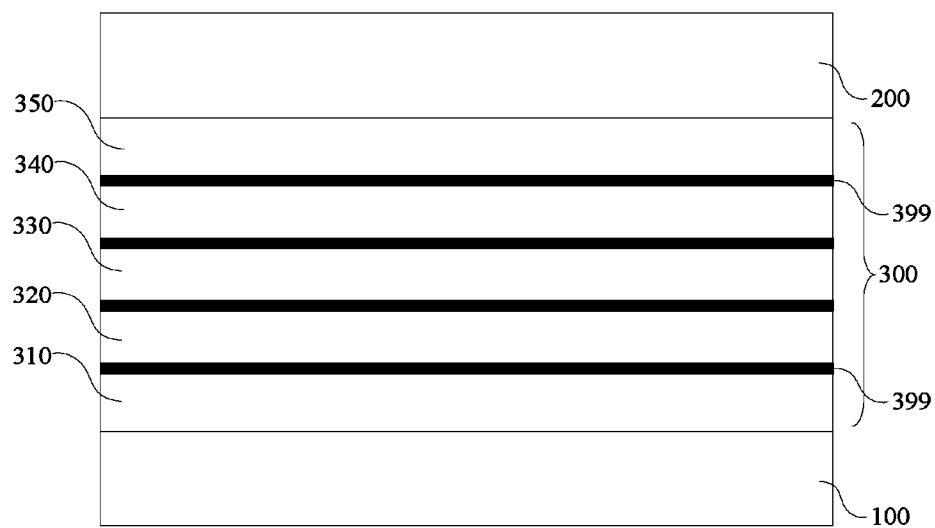
FIG. 2 is a structural schematic drawing of another OLED display module of a preferred embodiment of the present invention.

Please refer to FIG. 2, FIG. 2 is a structural schematic drawing of another OLED display module of a preferred embodiment of the present invention. The OLED display module of the present embodiment also comprises: a cathode plate 100, an anode plate 200 and a luminance function layer 300 sandwiched in between the cathode plate 100 and the anode plate 200. Multiple reflectivities among multiple layers of the luminance function layer 300 are satisfied with a following relationship, which is a reflectivity of the material of the luminance function layer 300 near to the cathode plate 100 is greatly higher than a reflectivity of another material of the luminance function layer 300 distant from the cathode plate 100. The luminance function layer 300 comprises sequentially along the direction from the cathode plate 100 to the anode plate 200 but is not limited to following functional layers: an electron ejection layer 310, an electron transport layer 320, a light emitting layer 330, a hole transport layer 340, a hole ejection layer 350, etc.

According to the previous embodiment, it can understand that more inequalities are satisfied and the effect is better. Thus, a downward gradient change of the reflectivities of n1 to n5, or more like n6, n7, n8 is increasingly large and the reflective effect of the cathode plate is improved better. FIG. 2 only discloses an arrangement of one type of a reflectivity-change layer 399, but another embodiment is not limited in this type as shown in the drawing. According to particular requirements of design, people who is skilled in the art can add different numbers of the reflectivity-change layers 399, so no more details thereof are described here.

Specifically, the reflectivity-change layer 399 is made of inorganic material. A thickness of the reflectivity-change layer 399 is less than 50 nm. Adding more reflectivity-change layers 399 is to improve the gradient change of the reflectivities. If the reflectivities of the material of the functional layers arranged along the direction from the cathode plate 100 to the anode plate 200 are respectively and sequentially represented as n1, n2, n3, n4, n5, n6, n7 . . . , and the reflectivities of the added reflectivity-change layers 399 arranged along the direction from the cathode plate 100 to the anode plate 200 are respectively and sequentially represented as n2', n3', n4', n5' . . . . The reflectivities are satisfied with relationships of n1>>n2', n2'>>n2, n2>>n3', n3'>>n3, n3>>n4', . . . . Similarly, if the N-layer structure is composed of the luminance function layer 300 and the reflectivity-change layers 399, the at least N–2 of the satisfied inequalities are required.

In the structure of the present embodiment, the visible light with 500 nm±25 nm luminance wavelength range generated by the luminance function layer 300 is employed. In addition, the nature, composition etc. features of the material of each of the anode plate 200, the cathode plate 100 and the luminance function layer 300 are the same as these of the previous embodiment, so the details thereof are not further described here.

In comparison with the prior art, the OLED display and the display module thereof provided by the present invention, the reflectivities among the layers of the luminance function are satisfied with a following relationship, which is the reflectivity of the material of the luminance function layer near to the cathode plate is greatly higher than the reflectivity of another material of the luminance function layer distant from the cathode plate. It solves the technical problem of decreasing the contrast and sharpness of the OLED display caused by the cathode plate with the high reflectivity. In addition, to satisfy that the reflectivity of the material of the luminance function layer is greatly higher than the reflectivity of another material of the luminance function layer distant from the cathode plate, the present invention solution forms one-layer or multi-layer reflectivity-change layer(s) among the layers of the luminance function layer. The luminance function layer is used to obtain the gradient change of the reflectivities and to make the luminance function layer satisfy with the requirement of the gradient change. It further improves the technical problem of decreasing the contrast and sharpness of the OLED display caused by the cathode plate with the high reflectivity.

Figure 3:
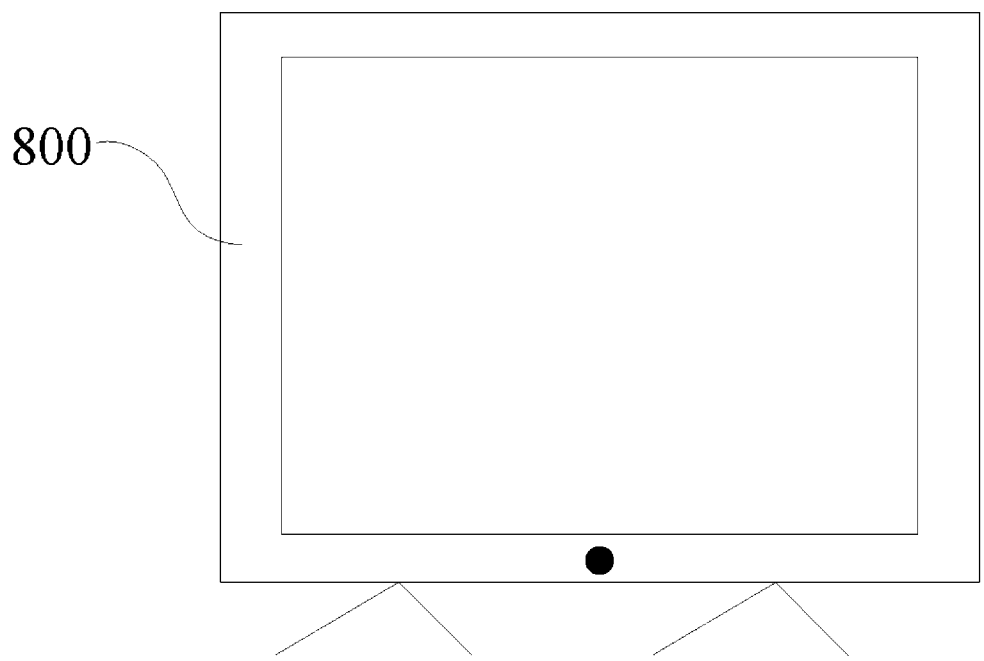
FIG. 3 is a simplified structural drawing of an OLED display of a preferred embodiment of the present invention.

In addition, the embodiment of the present invention also provides an OLED display and please refer to FIG. 3. FIG. 3 is simplified structural drawing of the OLED display of a preferred embodiment of the present invention. Wherein, the OLED display comprises a shell 800 and the above-mentioned OLED display module mounted inside the shell 800. Regarding the technological features of the OLED display module, please refer to the detail description of the above-mentioned embodiments. People who is skilled in the art can understand other technological features of other partial structures of the OLED display so the details thereof are not further described here.

Above are embodiments of the present invention, which does not limit the scope of the present invention. Any modifications, equivalent replacements or improvements within the spirit and principles of the embodiment described above should be covered by the protected scope of the disclosure.

What is claimed is:

1. An OLED display module, comprising: a cathode plate, an anode plate and a luminance function layer sandwiched in between the cathode plate and the anode plate, and characterized in that multiple reflectivities among multiple layers of the luminance function layer are satisfied with a following relationship, which is a reflectivity of a first material of the luminance function layer nearer to the cathode plate is higher than a reflectivity of a second material of the luminance function layer further from the cathode plate and adjacent to the first material;

wherein the luminance function layer comprises an electron ejection layer, an electron transport layer, a light emitting layer, a hole transport layer and a hole ejection layer sequentially along a direction from the cathode plate to the anode plate; and wherein a reflectivity of the electron ejection layer is higher than a reflectivity of the electron transport layer, a reflectivity of the electron transport layer is higher than a reflectivity of the light emitting layer, a reflectivity of the light emitting layer is higher than a reflectivity of the hole transport layer, a reflectivity of the hole transport layer is higher than a reflectivity of the hole ejection layer.

2. The OLED display module according to claim 1, characterized in that one-layer or multi-layer reflectivity-change layer(s) are formed among the layers of the luminance function layer, wherein for each reflectivity-change layer, a reflectivity of each reflectivity-change layer is less than a reflectivity of one layer of the luminance function layer which is disposed below the reflectivity-change layer and nearer to the cathode plate, and is greater than a reflectivity of another layer of the luminance function layer which is disposed above the reflectivity-change layer and further from the cathode plate.

3. The OLED display module according to claim 2, characterized in that the reflectivity-change layer is made of inorganic material.

4. The OLED display module according to claim 2, characterized in that a thickness of the reflectivity-change layer is less than 50 nm.

5. The OLED display module according to claim 1, characterized in that a visible light with 500 nm±25 nm luminance wavelength range generated by the luminance function layer.

6. The OLED display module according to claim 1, characterized in that a material of the hole ejection layer comprises one or more of CuPc, TCNQ, PPDN and TiOPC.

7. The OLED display module according to claim 1, characterized in that a material of the hole transport layer comprises one or more of TCTA, F4TCNQ, TCNQ, PPDN, CuPc and TiOPC; and the hole transport layer is a multi-layer structure.

8. The OLED display module according to claim 1, characterized in that the light emitting layer is made of a combination of phosphorescence material, TCTA and TAZ; a material of the electron transport layer comprises one or more of Alq3, BCP, Bphen, TPBi, Liq and Nbphen; and a material of the electron injection layer is one or more of LiF, LiBq4 and Alq3:Li3N.

9. An OLED display, characterized in that the OLED display comprises an OLED display module and the OLED display module comprises: a cathode plate, an anode plate and a luminance function layer sandwiched in between the cathode plate and the anode plate, and characterized in that multiple reflectivities among multiple layers of the luminance function layer are satisfied with a following relationship, which is a reflectivity of a first material of the luminance function layer nearer to the cathode plate is higher than a reflectivity of a second material of the luminance function layer further from the cathode plate and adjacent to the first material;

wherein the luminance function layer comprises an electron ejection layer, an electron transport layer, a light emitting layer, a hole transport layer and a hole ejection layer sequentially along a direction from the cathode plate to the anode plate; and wherein a reflectivity of the electron ejection layer is higher than a reflectivity of the electron transport layer, a reflectivity of the electron transport layer is higher than a reflectivity of the light emitting layer, a reflectivity of the light emitting layer is higher than a reflectivity of the hole transport layer, a reflectivity of the hole transport layer is higher than a reflectivity of the hole ejection layer.

10. The OLED display according to claim 9, characterized in that one-layer or multi-layer reflectivity-change layer(s) are formed among the layers of the luminance function layer, wherein for each reflectivity-change layer, a reflectivity of each reflectivity-change layer is less than a reflectivity of one layer of the luminance function layer which is disposed below the reflectivity-change layer and nearer to the cathode plate, and is greater than a reflectivity of another layer of the luminance function layer which is disposed above the reflectivity-change layer and further from the cathode plate.

11. The OLED display according to claim 10, characterized in that the reflectivity-change layer is made of inorganic material.

12. The OLED display according to claim 10, characterized in that a thickness of the reflectivity-change layer is less than 50 nm.

13. The OLED display according to claim 9, characterized in that a visible light with 500 nm±25 nm luminance wavelength range generated by the luminance function layer.

14. The OLED display according to claim 9, characterized in that a material of the hole ejection layer comprises one or more of CuPc, TCNQ, PPDN and TiOPC.

15. The OLED display according to claim 9, characterized in that a material of the hole transport layer comprises one or more of TCTA, F4TCNQ, TCNQ, PPDN, CuPc and TiOPC; and the hole transport layer is a multi-layer structure.

16. The OLED display according to claim 9, characterized in that the light emitting layer is made of a combination of phosphorescence material, TCTA and TAZ; a material of the electron transport layer comprises one or more of Alq3, BCP, Bphen, TPBi, Liq and Nbphen; and a material of the electron injection layer is one or more of LiF, LiBq4 and Alq3:Li3N.

* * * * *